United States Patent [19]
Pascucci

[11] Patent Number: 5,959,917
[45] Date of Patent: Sep. 28, 1999

[54] CIRCUIT FOR DETECTING THE COINCIDENCE BETWEEN A BINARY INFORMATION UNIT STORED THEREIN AND AN EXTERNAL DATUM

[75] Inventor: Luigi Pascucci, Sesto San Giovanni, Italy

[73] Assignee: SGS-Thomson Microelectronics S.r.l., Agrate Brianza, Italy

[21] Appl. No.: 08/819,519

[22] Filed: Mar. 17, 1997

[30] Foreign Application Priority Data

Mar. 22, 1996 [EP] European Pat. Off. ............. 96830143

[51] Int. Cl.$^6$ ..................................................... G11C 7/00
[52] U.S. Cl. ...................... 365/205; 365/207; 365/185.2; 365/185.21; 365/210
[58] Field of Search ................................. 365/205, 206, 365/207, 185.21, 185.2, 210

[56] References Cited

U.S. PATENT DOCUMENTS

| | | | |
|---|---|---|---|
| 4,571,707 | 2/1986 | Watanabe | 365/200 |
| 5,300,840 | 4/1994 | Drouot | 307/530 |
| 5,345,110 | 9/1994 | Renfro et al. | 307/272.3 |
| 5,396,449 | 3/1995 | Atallah et al. | 365/49 |
| 5,428,571 | 6/1995 | Atsumi et al. | 365/189 |
| 5,524,094 | 6/1996 | Nobukata et al. | 365/185.21 |
| 5,530,671 | 6/1996 | Hashimoto | 365/185.21 |
| 5,659,503 | 8/1997 | Sudo et al. | 365/185.21 |

FOREIGN PATENT DOCUMENTS

| | | | |
|---|---|---|---|
| 0 116 440 | 8/1984 | European Pat. Off. | G06F 11/20 |
| 0 336 500 | 10/1989 | European Pat. Off. | G11C 17/04 |

OTHER PUBLICATIONS

European Search Report from EP 96830143, filed Mar. 22, 1996.

*Primary Examiner*—Son T. Dinh
*Attorney, Agent, or Firm*—Wolf, Greenfield & Sacks, P.C.

[57] ABSTRACT

A circuit for detecting the coincidence between a binary information unit stored therein and an external datum comprises at least one programmable memory element, a sensing circuit for reading a datum stored in the programmable memory element and a digital comparator for comparing the datum stored in the programmable memory element with the external datum. The sensing circuit comprises a bistable latch having at least one set input coupled to the programmable memory element and an output suitable to take either one of two logic levels according to a programming state of the programmable memory element, the output supplying directly the digital comparator.

27 Claims, 1 Drawing Sheet

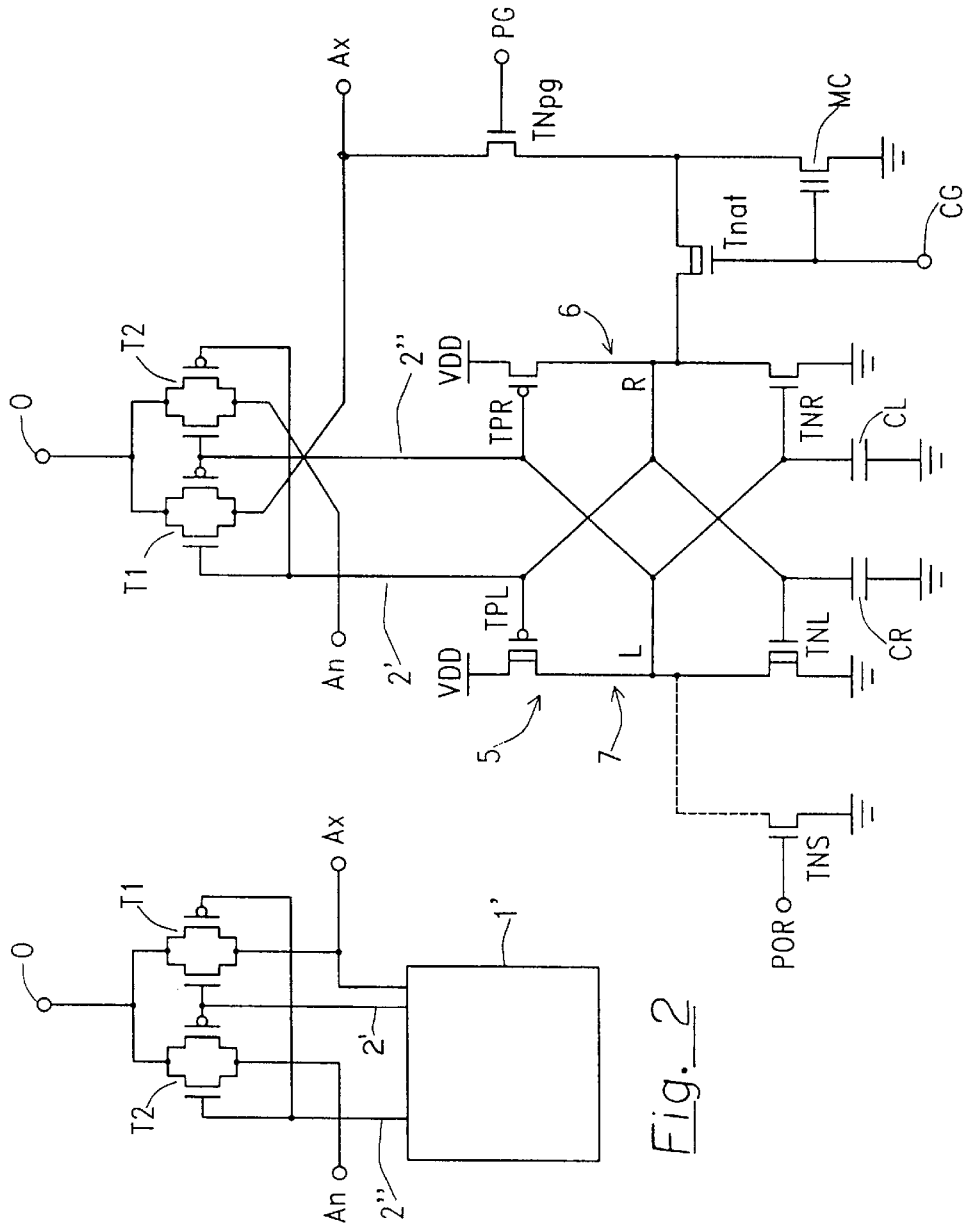
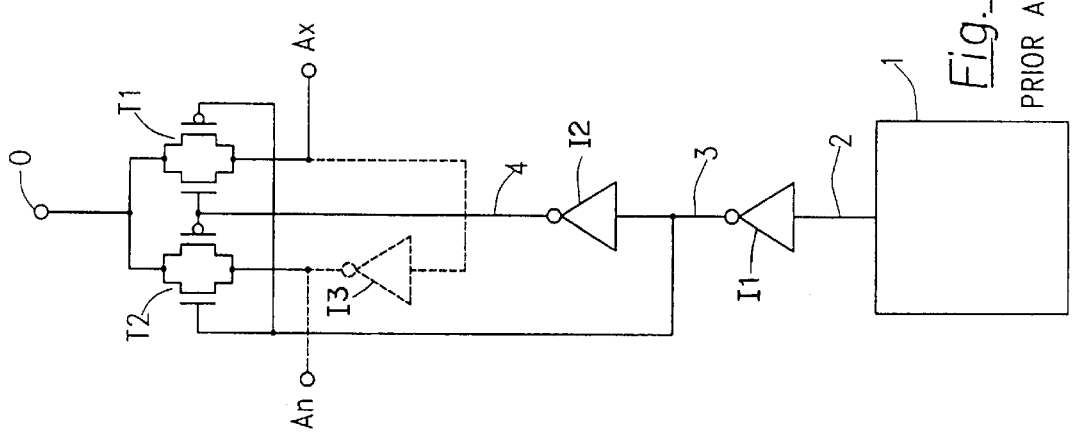

CIRCUIT FOR DETECTING THE COINCIDENCE BETWEEN A BINARY INFORMATION UNIT STORED THEREIN AND AN EXTERNAL DATUM

BACKGROUND OF THE INVENTION

1. Field of the Invention

The present invention relates to a circuit for detecting the coincidence between a binary information unit stored therein and an external datum.

2. Description of the Related Art

In semiconductor memories it is often necessary to provide programmable circuits for storing a binary information unit and for performing a comparison between the datum stored therein and a datum carried by a generic control line, in order to detect the coincidence between the two data.

For example, a known application of such circuits is in the implementation of redundancy memory. Conventionally, in semiconductor memories it is a common technique to provide, within the memory device chip, redundancy memory elements suitable to functionally replace defective memory elements.

The redundancy memory elements are generally formed by bit lines and/or word lines of redundancy memory cells. During the in-factory testing of the memory device, the redundancy bit lines and word lines are associated with respective defective bit lines and word lines, respectively. In this way, during normal operation, redundancy bit lines and word lines are activated whenever the associated defective bit lines and word lines are addressed, and the latter are not accessed.

To perform this function, programmable non-volatile memory registers (redundancy registers) must be provided in the memory device to permanently store the addresses of the defective bit lines and word lines for each redundancy bit line, as well as for each redundancy word line, a respective non-volatile memory register must be provided to store the address of the defective bit line or word line which is to be replaced by the redundancy bit line or word line.

The redundancy registers are formed by a number of programmable non-volatile memory units at least equal to the number of column address bits or row address bits. Each programmable non-volatile memory unit must store a respective address bit of the address configuration of a defective bit line or word line, and must perform a comparison of the address bit stored therein with the corresponding bit of the current address supplied to the memory device. When the current address bit coincides with the address bit stored in the memory unit, a coincidence signal is activated. If all the current address bits coincide with the defective address bits stored in the memory units of a redundancy register, the associated redundancy bit line or word line is activated in substitution for the defective bit line or word line.

The programmable elementary memory units should occupy a small area and have low power consumption, because they are often provided in great number. Also, they should be fast in performing the comparison between the datum stored therein with the datum carried by the associated control line. For example, considering the application described above, the detection of the coincidence of the current address with a defective address stored in a redundancy register must be performed as fast as possible so as not to degrade the access time of the memory device.

FIG. 1 schematically shows the structure of a known programmable elementary memory unit. Block 1 schematizes a programmable memory element (generally a non-volatile memory element such as, for example, an EPROM cell) and the associated sensing circuit for sensing the datum stored in the programmable memory element; an output line 2 of block 1 carries a logic level representative of the datum stored in the programmable memory element. A buffer stage comprising a cascade of two inverters I1, I2 is provided. Inverters I1, I2 control a digital comparator comprising two transfer gates T1, T2. Transfer gate T1 has an N-channel MOSFET controlled by an output 4 of I2 and a P-channel MOSFET controlled by an output 3 of inverter I1. Transfer gate T2 has an N-channel MOSFET controlled by the output 3 of inverter I1 and a P-channel MOSFET controlled by the output 4 of inverter I2. According to the logic level of line 2, either transfer gate T1 is open and transfer gate T2 closed or transfer gate T1 is closed and transfer gate T2 open. Transfer gate T1 receives at its input, a control line Ax, for example an address line, while transfer gate T2 receives at its input a control line An which carries the logic complement of the datum carried by line Ax. When the signal line An is not available, it can be locally generated by means of an inverter I3 (shown in dashed line). The outputs of transfer gates T1 and T2 are commonly connected to an output line O.

Supposing that line 2 carries a "1", transfer gate T1 is open and transfer gate T2 is closed, and output line O=Ax; if line Ax="1" then output line O="1", while if line Ax="0" then output line O=0. If instead line 2 carries a "0", transfer gate T1 is closed and transfer gate T2 is open, and output line O=An; if line Ax="1" then line An="0" and output line O="0", while if line Ax=0 then An="1" and ="1". In other words, if the datum stored in the programmable memory element is a logic "1", then output line O is a "1" only if line Ax is a "1"; if instead the datum stored in the programmable memory element is a logic "0", then output line O is a "1" only if line Ax is a "0". Differently said, output line O is equal to "1" only if the datum carried by line Ax coincides with the datum stored in the programmable memory element.

Up to now, the skilled persons have considered the provision of the buffer stage formed by inverters I1 and I2 essential to prevent malfunctioning of the sensing circuit associated with the programmable memory element, such as erroneous sensing of the actual programming state of the memory element determined by the loading of the sensing circuit by the circuits downstream of it. Inverters I1 and I2, decoupling the sensing circuit from the remaining circuits, assure that such errors are prevented. However, invertors I1 and I2 occupy a finite chip area, slow the comparison process and introduce extra power consumption. These problems are exacerbated by the fact that generally a great number of the circuits shown in FIG. 1 need to be integrated in a memory device chip.

SUMMARY OF THE INVENTION

In view of the state of the art described, it is an object of the present invention to provide a circuit for detecting the coincidence between a binary information unit stored therein and an external datum which occupies a smaller area, is faster and has a reduced power consumption with respect to the known circuits.

According to the present invention, such object is attained by means of a circuit for detecting the coincidence between a binary information unit stored therein and an external datum, comprising:

at least one programmable memory element;

a sensing circuit for reading a datum stored in the programmable memory element; and a digital comparator for comparing the datum stored in the programmable memory element with said external datum, characterized in that said sensing circuit comprises a bistable latch having at least one set input coupled to said programmable memory element and an output suitable to take either one of two logic levels according to a programming state of the programmable memory element, said output supplying directly the digital comparator.

Thanks to the present invention, a circuit for detecting the coincidence between a binary information unit stored therein and an external datum is provided wherein the sensing circuit directly supplies the digital comparator, without the provision of any buffer stage for decoupling the sensing circuit from the digital comparator. This is allowed because the sensing circuit, being a bistable latch, is not affected by problems of erroneous sensing of the datum stored in the memory element: once the bistable latch has been set, it is very difficult to reset erroneously due to its intrinsic stability. The circuit of the present invention occupies a smaller area, is faster and has a lower power consumption than the conventional circuits.

BRIEF DESCRIPTION OF THE DRAWINGS

The features and advantages of the present invention will be made more apparent by the following detailed description of one particular embodiment, described as a non-limiting example with reference to the annexed drawings, wherein:

FIG. 1 schematically shows the structure of a circuit for detecting the coincidence between a binary information unit stored therein and an external datum according to the prior art;

FIG. 2 schematically shows the structure of a circuit for detecting the coincidence between a binary information unit stored therein and an external datum according to the present invention; and FIG. 3 shows the detailed structure of the circuit schematically shown in FIG. 2.

DETAILED DESCRIPTION

FIG. 1 shows the schematic structure of a conventional programmable elementary memory unit, and has already been described.

FIG. 2 shows the schematic structure of a circuit according to the present invention. A block 1' schematizes a programmable memory element (preferably a non-volatile memory element such as, for example, an EPROM cell) and an associated sensing circuit which will be described in detail in the following. Block 1 has two output lines 2' and 2" which carry a logic level representative of the datum stored in the programmable memory element and the logic complement thereof, respectively. Output lines 2' and 2" directly control a digital comparator comprised of two transfer gates T1, T2; differently from the prior-art circuits (FIG. 1), i.e., no buffer stage is provided between the output lines 2', 2" of block 1 and the transfer gates T1, T2.

Transfer gate T1 is supplied with a control line Ax (such as, for example, an address signal line); transfer gate T2 is supplied with a control line An carrying the logic complement of the datum carried by line Ax. Line An could be available in the memory device wherein the circuit is integrated, or it could be locally generated by means of an inverter (for example, inverter I3 in FIG. 1). The outputs of transfer gates T1 and T2 are commonly connected to the output line O.

The operation of the circuit of FIG. 2 is similar to that of the circuit of FIG. 1: if the datum stored in the programmable memory element is a logic "1", output line 2'="1" and output line 2"="0", transfer gate T1 is open and T2 is closed, and output line O=Ax. If instead the datum stored in the programmable memory element is a "0", output line 2'="0" and output line 2"="1", transfer gate T1 is closed and transfer gate T2 is open, and output line O=An. As for the circuit of FIG. 2, output line O='1' only if the datum carried by line Ax coincides with the datum stored in the programmable memory element.

FIG. 3 shows the detailed circuit structure of the circuit schematically shown in FIG. 2.

The circuit shown in FIG. 3 comprises a programmable memory element MC, in this example a floating-gate MOS transistor of the type used to form EPROM memory cells, with its source connected to ground, its drain coupled to the signal line Ax through a decoupling transistor TNpg, and its control gate controlled by a control signal CG.

The circuit also comprises a bistable latch 5 having a right branch 6 and a left branch 7. The right branch 6 comprises a P-channel MOSFET TPR and an N-channel MOSFET TNR connected in series between a voltage supply VDD (typically a 5 V or a 3 V voltage supply) and a ground reference voltage. The left branch 7 comprises a P-channel MOSFET TPL and an N-channel MOSFET TNL connected in series between the voltage supply VDD and the ground reference voltage. A common node R of MOSFETs TPR and TNR in the right branch 6 is connected to gate electrodes of MOSFETs TPL and TNL in the left branch 7. A common node of MOSFETs TPL and TNL in the left branch 7 is connected to gate electrodes of MOSFETs TPR and TNR in the right branch 6. Node R is also connected, through an N-channel MOSFET Tnat controlled by the control signal CG, to the drain of the floating-gate MOS transistor MC. Two capacitors CR and CL are preferably provided between node R and ground, and between node L and ground, respectively. Capacitors CR and CL facilitate the proper setting of latch 5 at circuit power-up.

An N-channel MOSFET TNS could also be provided between node L and the ground reference voltage. MOSFET TNS is controlled by a signal POR which is temporarily activated at circuit power-up to guarantee the appropriate setting of latch 5. Also, signal POR could be activated in particular test modes to set the latch 5 to a predetermined condition.

The two branches 6, 7 of latch 5 are not perfectly symmetric to one another: the P-channel MOSFET TPR in the right branch is fabricated to have a threshold voltage lower (in absolute value) than the threshold voltage of P-channel MOSFET TPL in the left branch. As an example, TPR has a threshold voltage of approximately −0.9V while MOSFET TPL has a threshold voltage of approximately −1.6V. Also, the N-channel MOSFET TNR in the right branch is fabricated to have a threshold voltage higher than the threshold voltage of the N-channel MOSFET TNL in the left branch. As an example, MOSFET TNR has a threshold voltage of approximately 0.8V while MOSFET TNL has a threshold voltage of approximately 0.4V. Latch 5 is therefore unbalanced. Nodes R and L also form the outputs 2' and 2", respectively, of block 1 shown in FIG. 2, and directly control the transfer gates T1 and T2 without the interposition of a buffer stage.

The operation of the circuit of FIG. 3 will now be explained.

Signal lines Ax and An can take digital voltage levels of 0V and 5V or 3V.

Signal PG is normally kept at zero volts, but it is raised to approximately 12V when the memory element MC must be programmed. Signal CG is normally kept at 5V (or lower), but it is also raised to approximately 12V when memory element MC must be programmed.

To program the memory element MC, signals CG and PG are raised to approximately 12 V; if the datum memory element carried by line Ax is a logic "0", the potential on the drain of memory element MC is zero volts, and memory element MC does not program. If instead the datum carried by line Ax is a logic "1" the potential on the drain of MC is 5V, and electrons are injected into the floating gate of memory element MC and the threshold voltage of memory element MC increases.

At circuit power-up, when the voltage supply VDD increases from zero volts to the prescribed value of 5V or 3V, node L in the left branch sets low and node R in the right branch sets high; this is made possible by the very fact that latch 5 is unbalanced as previously described. In fact, capacitors CR and CL initially keep nodes R and L at the ground voltage, but since MOSFET TPL in the left branch has a lower threshold voltage than MOSFET TPR in the right branch, the current flowing in the left branch is higher than the current flowing in the right branch; for this reason the potential of node R is a little higher than that of node L, MOSFET TNL begins to turn on pulling node L to ground and thus MOSFET TNR turns off and MOSFET TPR turns on, raising the potential of node R to VDD. However, the initial setting of latch 5 could be facilitated if MOSFET TNS is provided, controlled by signal POR which is temporarily activated when the voltage supply VDD reaches a predetermined voltage; signal POR can be generated by any known "Power-On Reset" circuit which is normally provided in memory devices.

If the memory element MC is programmed (high threshold voltage), it will not drain current and node R remains high; transfer gate T1 will be open and transfer gate T2 will be closed, so that output line O=Ax; output line O will be equal to "1" only if Ax="1", i.e., only if the datum carried by control line Ax coincides with the datum stored in the memory element MC. If instead memory element MC is not programmed (virgin), it will drain current from MOSFET TPR in the right branch of latch 5; node R is pulled toward ground, MOSFET TPL turns on and node L rises toward VDD; transfer gate T1 will be closed and T2 will be open, so that output line O=An; output line O will be equal to "1" only if control line An="1", that means control line Ax="0"; again, output line O will be equal to "1" only if the datum carried by control line Ax coincides with the datum stored in the memory element MC.

MOSFET Tnat is useful during the initial setting of latch 5 at power-up (when R goes high) to limit the voltage on the drain of memory element MC.

The programmable elementary memory unit according to the present invention can be used to form a programmable memory register, for example, a redundancy memory register provided in a memory device to store an address of a defective bit line or word line. In this case, signal line Ax represents an address signal line. Once the bistable latch 5 has been set, no steady-state current flows in the two branches 6 and 7: the programmable memory unit does not have a static power consumption. This is true both when the programmable memory element MC is in the programmed state and if the programmable memory element MC is in the virgin state. This latter state is the condition that exists before the memory element MC is programmed. For example, in a memory device with redundancy, the redundancy registers are initially unprogrammed. Thanks to the fact that also in the unprogrammed state the memory units of the redundancy registers do not dissipate power, it is easy to perform tests for determining the power consumption of the memory device.

The programmable elementary memory unit according to the present invention does not need a buffer stage to decouple the output of latch 5 from the transfer gates T1, T2: the latch 5, being unbalanced as previously described, is not subject to erroneous settings caused by the circuits downstream of it. This allows a significant saving of chip area, especially when a great number of these circuits are to be integrated (for example in the implementation of redundancy), and a reduced power consumption. The circuit is also fast, because the datum stored in the memory element MC is read only once, at the circuit power-up, and remains stored in the latch 5; the only delay introduced by this circuit is the time necessary to a transition of the signal line Ax to propagate through the transfer gates T1, T2.

The present invention is not limited to the particular embodiment previously described: for example, the bistable latch 5 could have a different structure, and two programmable memory elements suitable to be programmed in complementary states could be used instead of a single one.

What is claimed is:

1. A circuit for detecting a coincidence between a binary information unit stored therein and an external datum, the circuit comprising:

at least one programmable memory element;

a sensing circuit for reading a datum stored in the at least one programmable memory element; and a digital comparator for comparing the datum stored in the at least one programmable memory element with said external datum, wherein said sensing circuit comprises a bistable latch having a reset input, a set input coupled to said at least one programmable memory element and an output suitable to take either one of two logic levels according to a programming state of the programmable memory element, said output supplying directly the digital comparator, and wherein the bistable latch output, once set to the one of two logic levels, remains at the one of two logic levels, irrespective of a subsequent change of the programming state of the programmable memory element, until a reset signal is applied to the reset input.

2. The circuit according to claim 1, wherein said output of the sensing circuit comprises a first output and a complemented output, the complemented output being the logic complement of the first output, and said digital comparator comprises a first switching means controlled by said first output for connecting a first signal line carrying said external datum to an output line, and a second switching means controlled by said complemented output for connecting a second signal line carrying a logic complement of said external datum to the output line, the second switching means being open when the first switching means are closed and vice-versa.

3. The circuit according to claim 2, wherein said first switching means comprise a first transfer gate comprising a first N-channel MOSFET and a first P-channel MOSFET parallel-connected and respectively controlled by said first output and said second output, and the second switching means comprise a second transfer gate comprising a second N-channel MOSFET and a second P-channel MOSFET parallel-connected and respectively controlled by said second output and said first output.

4. The circuit according to claim 3, wherein said bistable latch comprises a first circuit branch and a second circuit branch, the first circuit branch comprising a third P-channel MOSFET and a third N-channel MOSFET connected in series between a voltage supply line and a reference voltage line, the second circuit branch comprising a fourth P-channel MOSFET and a fourth N-channel MOSFET connected in series between the voltage supply line and the reference voltage line, a common node of the third P-channel and N-channel MOSFETs forming the set input and the first output of the bistable latch and being connected to gate electrodes of the fourth P-channel and N-channel MOSFETs, and a common node of the fourth P-channel and N-channel MOSFETs forming a reset input and the second output of the bistable latch and being connected to gate electrodes of the third P-channel and N-channel MOSFETs.

5. The circuit according to claim 4, wherein said first and second circuit branches are unbalanced, the fourth P-channel MOSFET having a threshold voltage lower than that of the third P-channel MOSFET and the fourth N-channel MOSFET having a threshold voltage lower than that of the third N-channel MOSFET.

6. The circuit according to claim 5, wherein said programmable memory element is a floating-gate MOS transistor having a source electrode connected to the reference voltage line and a drain electrode coupled to the set input of the bistable latch through voltage-limiting means.

7. The circuit according to claim 6, further comprising a programming circuit for programming the programmable memory element, the programming circuit comprising switching means for selectively coupling a programming electrode of the memory element to said first signal line.

8. The circuit according to claim 6, further comprising resetting means for resetting the bistable latch.

9. The circuit according to claim 8, wherein said resetting means comprise a reset transistor coupled between the reset input of the bistable latch and the reference voltage line and controlled by a reset signal.

10. A memory register for detecting a coincidence between a binary code stored therein and an external binary code including a plurality of coincidence detecting circuits to detect the coincidence between a bit of the binary code stored in the memory register and a respective bit of the external binary code, wherein each coincidence detecting circuit comprises:

at least one programmable memory element;

a sensing circuit for reading a datum stored in the at least one programmable memory element; and a digital comparator for comparing the datum stored in the at least one programmable memory element with said external datum, wherein said sensing circuit comprises a bistable latch having a reset input, a set input coupled to said at least one programmable memory element and an output suitable to take either one of two logic levels according to a programming state of the programmable memory element, said output supplying directly the digital comparator, and wherein the bistable latch output, once set to the one of two logic levels, remains at the one of two logic levels, irrespective of a subsequent change of the programming state of the programmable memory element, until a reset signal is applied to the reset input.

11. The circuit according to claim 10, wherein said output of the sensing circuit comprises a first output and a complemented output, the complemented output being the logic complement of the first output, and said digital comparator comprises a first switching means controlled by said first output for connecting a first signal line carrying said external datum to an output line, and a second switching means controlled by said complemented output for connecting a second signal line carrying a logic complement of said external datum to the output line, the second switching means being open when the first switching means are closed and vice-versa.

12. The circuit according to claim 11, wherein said first switching means comprise a first transfer gate comprising a first N-channel MOSFET and a first P-channel MOSFET parallel-connected and respectively controlled by said first output and said second output, and the second switching means comprise a second transfer gate comprising a second N-channel MOSFET and a second P-channel MOSFET parallel-connected and respectively controlled by said second output and said first output.

13. The circuit according to claim 12, wherein said bistable latch comprises a first circuit branch and a second circuit branch, the first circuit branch comprising a third P-channel MOSFET and a third N-channel MOSFET connected in series between a voltage supply line and a reference voltage line, the second circuit branch comprising a fourth P-channel MOSFET and a fourth N-channel MOSFET connected in series between the voltage supply line and the reference voltage line, a common node of the third P-channel and N-channel MOSFETs forming the set input and the first output of the bistable latch and being connected to gate electrodes of the fourth P-channel and N-channel MOSFETs, and a common node of the fourth P-channel and N-channel MOSFETs forming a reset input and the second output of the bistable latch and being connected to gate electrodes of the third P-channel and N-channel MOSFETs.

14. The circuit according to claim 13, wherein said first and second circuit branches are unbalanced, the fourth P-channel MOSFET having a threshold voltage lower than that of the third P-channel MOSFET and the fourth N-channel MOSFET having a threshold voltage lower than that of the third N-channel MOSFET.

15. The circuit according to claim 14, wherein said programmable memory element is a floating-gate MOS transistor having a source electrode connected to the reference voltage line and a drain electrode coupled to the set input of the bistable latch through voltage-limiting means.

16. The circuit according to claim 15, further comprising a programming circuit for programming the programmable memory element, the programming circuit comprising switching means for selectively coupling a programming electrode of the memory element to said first signal line.

17. The circuit according to claim 15, further comprising resetting means for resetting the bistable latch.

18. The circuit according to claim 17, wherein said resetting means comprise a reset transistor coupled between the reset input of the bistable latch and the reference voltage line and controlled by a reset signal.

19. A circuit for detecting a coincidence between a binary information unit stored therein and an external datum, the circuit comprising:

programmable memory means;

means for reading a datum stored in the programmable memory means; and means for comparing the datum stored in the programmable memory means with said external datum, wherein said reading means comprise a bistable means having a reset input, a set input coupled to said programmable memory means and an output suitable to take either one of two logic levels according to a programming state of the programmable memory means, said output supplying directly the comparing means, and wherein the bistable means output, once set to the one of two logic levels, remains at the one of two logic levels, irrespective of a subsequent change of the programming state of the programmable memory element, until a reset signal is applied to the reset input.

20. An apparatus, comprising:

a bistable latch circuit having a first latch input to receive a first latch input signal at one of a first and second level, a second latch input signal to receive a second latch input signal at one of the first and second levels, and first and second latch outputs to output a first latch output signal on the first latch output at the first level and to output a second latch output signal on the second latch output at the second level when the first latch input signal is at the first level and, when the first latch input signal is at the second level, to output the first latch output signal at the second level and the second latch output signal at the first level; and a buffer circuit having a buffer output, first and second buffer inputs to receive, respectively, first and second buffer input signals and first and second buffer control inputs coupled, respectively, to the first and second latch outputs signals, wherein the buffer circuit outputs the first buffer input signal when the second latch output signal is at the second level and outputs the second buffer input signal when the second latch output signal is at the first level, wherein each of the first and second latch outputs, once set to the one of first and second levels, remains at the one of first and second levels, irrespective of a subsequent change of the first latch input signal, until a second latch input signal is applied to the second latch.

21. The apparatus according to claim 20, wherein the bistable latch circuit comprises a first circuit branch and a second circuit branch, the first circuit branch comprising a third P-channel MOSFET and a third N-channel MOSFET connected in series between a voltage supply line and a reference voltage line, the second circuit branch comprising a fourth P-channel MOSFET and a fourth N-channel MOSFET connected in series between the voltage supply line and the reference voltage line, a common node of the third P-channel and N-channel MOSFETs forming the first latch input and the first latch output of the bistable latch circuit and being connected to gate electrodes of the fourth P-channel and N-channel MOSFETs, and a common node of the fourth P-channel and N-channel MOSFETs forming a second latch input and the second latch output of the bistable latch circuit and being connected to gate electrodes of the third P-channel and N-channel MOSFETs.

22. The apparatus according to claim 21, wherein said first and second circuit branches are unbalanced, the fourth P-channel MOSFET having a threshold voltage lower than that of the third P-channel MOSFET and the fourth N-channel MOSFET having a threshold voltage lower than that of the third N-channel MOSFET.

23. The apparatus according to claim 20 further comprising:

a programmable memory element having an output coupled to the first latch input to provide the first latch input signal.

24. The apparatus according to claim 23, wherein said programmable memory element is a floating-gate MOS transistor having a source electrode connected to the reference voltage line and a drain electrode coupled to the first latch input of the bistable latch circuit.

25. The apparatus according to claim 24, further comprising a programming circuit for programming the programmable memory element, the programming circuit comprising a switching circuit to selectively couple a programming electrode of the memory element to said first buffer input signal.

26. The apparatus according to claim 20 wherein the first and second buffer input signals are logical complements to one another.

27. The apparatus according to claim 21, further comprising:

a resetting circuit coupled between the second latch input and the reference voltage line, the resetting circuit to couple the second latch input to the reference voltage line as controlled by a reset signal.

* * * * *